US012763739B2

(12) United States Patent
Sandhu et al.

(10) Patent No.: US 12,763,739 B2
(45) Date of Patent: Oct. 13, 2026

(54) DELAY-LINE METHOD FOR SLEW RATE CONTROL FOR CLASS D DRIVER

(71) Applicant: Nuvoton Technology Corporation, Hsinchu (TW)

(72) Inventors: Bal Sandhu, San Jose, CA (US); Chang-Xian Wu, San Jose, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 440 days.

(21) Appl. No.: 18/518,431

(22) Filed: Nov. 22, 2023

(65) Prior Publication Data

US 2025/0167741 A1 May 22, 2025

(51) Int. Cl.
*H03F 3/217* (2006.01)

(52) U.S. Cl.
CPC ....... *H03F 3/2171* (2013.01); *H03F 2200/03* (2013.01); *H03F 2200/351* (2013.01)

(58) Field of Classification Search
CPC ............... H03F 3/2171; H03F 2200/03; H03F 2200/351; H03F 3/187; H03F 3/2173; H03F 3/217; H03F 2203/45248; H03F 3/38; H03K 7/08
USPC ........................................ 330/10, 207 A, 251
See application file for complete search history.

(56) References Cited

U.S. PATENT DOCUMENTS

2008/0116972 A1* 5/2008 McMorrow .............. H04B 1/44 330/264
2010/0066446 A1* 3/2010 Basten .................... H03F 1/223 330/251
2016/0329868 A1* 11/2016 Liu ..................... H03F 3/45475

* cited by examiner

*Primary Examiner* — Khanh V Nguyen
(74) *Attorney, Agent, or Firm* — Kilpatrick Townsend & Stockton LLP

(57) ABSTRACT

A class-D amplifier includes: a p-type output transistor; an n-type output transistor connected in series with the p-type output transistor; and a drive circuit connected to a gate of the p-type output transistor and a gate of the n-type output transistor. The drive circuit receives an input signal, generates a p-type output transistor control signal applied to the gate of the p-type output transistor, and generates an n-type output transistor control signal applied to the gate of the n-type output transistor. When the input signal becomes logic high, the n-type output transistor control signal becomes logic low fast, while the p-type output transistor control signal becomes logic low gradually. When the input signal becomes logic low, the p-type output transistor control signal becomes logic high fast, while the n-type output transistor control signal becomes logic high gradually.

20 Claims, 10 Drawing Sheets

*-Prior Art-*

DELAY-LINE METHOD FOR SLEW RATE CONTROL FOR CLASS D DRIVER

FIELD

This invention relates to the field of electronic circuits in audio systems. More particularly, the present invention relates to auto-calibration control for class-D amplifier driver circuits.

BACKGROUND

A class-D amplifier, also known as a switching amplifier, is an electronic amplifier in which transistors operate as binary switches. They are either fully on or fully off. Class-D amplifiers employ rail-to-rail output switching, where, ideally, their output transistors virtually always carry either zero current or zero voltage. Thus, their power dissipation is minimal, and they provide high efficiency over a wide range of power levels. Their advantageous high efficiency has propelled their use in various audio applications, from cell phones to flat screen televisions and home theater receivers. Class-D audio power amplifiers are more efficient than class-AB audio power amplifiers. Because of their greater efficiency, class-D amplifiers require smaller power supplies and eliminate heat sinks, thus significantly reducing overall system costs, size, and weight.

BRIEF SUMMARY OF THE INVENTION

One general aspect includes a class-D amplifier. The class-D amplifier includes a p-type output transistor. The class-D amplifier also includes an n-type output transistor connected in series with the p-type output transistor. The class-D amplifier also includes a drive circuit connected to a gate of the p-type output transistor and a gate of the n-type output transistor, where the drive circuit receives an input signal, and the drive circuit generates, in response to the input signal, a p-type output transistor control signal applied to the gate of the p-type output transistor, and the drive circuit generates, in response to the input signal, an n-type output transistor control signal applied to the gate of the n-type output transistor. When the input signal becomes logic high, the n-type output transistor control signal becomes logic low fast, while the p-type output transistor control signal becomes logic low gradually. When the input signal becomes logic low, the p-type output transistor control signal becomes logic high fast, while the n-type output transistor control signal becomes logic high gradually.

Implementations may include one or more of the following features. In some embodiments, when the input signal becomes logic high, the n-type output transistor control signal becomes logic low fast, while the p-type output transistor control signal becomes logic low gradually, so that the p-type output transistor is turned on gradually after the n-type output transistor is turned off. In some embodiments, when the input signal becomes logic high, the p-type output transistor control signal becomes logic low in a stepwise manner. In some embodiments, when the input signal becomes logic low, the p-type output transistor control signal becomes logic high fast, while the n-type output transistor control signal becomes logic high gradually, so that the n-type output transistor is turned on gradually after the p-type output transistor is turned off. In some embodiments, when the input signal becomes logic low, the n-type output transistor control signal becomes logic high in a stepwise manner.

In some embodiments, the drive circuit may include: a pulse width modulation (PWM) signal generator generating the input signal; a multi-bit delay line circuit, where the multi-bit delay line circuit receives the input signal and generates a plurality of delayed input signals; an n-type current digital-to-analog converter (IDAC) configured to generate a first current in response to the plurality of delayed input signals; an n-type transistor connected between the p-type output transistor and the n-type IDAC; a p-type IDAC configured to generate a second current in response to the plurality of delayed input signals; and a p-type transistor connected between the n-type output transistor and the p-type IDAC. In some embodiments, when the input signal becomes logic high, the p-type transistor is turned off, thereby disconnecting the p-type IDAC from the n-type output transistor, while the n-type output transistor control signal becomes logic low. In some embodiments, when the input signal becomes logic high, the n-type transistor is turned on, thereby connecting the n-type IDAC to the p-type output transistor, and the p-type output transistor control signal decreases as the first current increases. In some embodiments, when the input signal becomes logic low, the n-type transistor is turned off, thereby disconnecting the n-type IDAC from the p-type output transistor, while the p-type output transistor control signal becomes logic high. In some embodiments, when the input signal becomes logic low, the p-type transistor is turned on, thereby connecting the p-type IDAC to the n-type output transistor, and the n-type output transistor control signal increases as the second current increases.

In some embodiments, the input signal is a PWM signal. In some embodiments, the multi-bit delay line circuit may include a plurality of delay cells connected in series, each delay cell providing a delay time. In some embodiments, the delay time of the plurality of delay cells vary.

In some embodiments, the p-type IDAC may include: a first current source; a first p-type transistor; and a plurality of current branches, where the plurality of current branches corresponds to the plurality of delayed input signals and provide a plurality of current components. In some embodiments, the n-type IDAC may include: a second current source; a first n-type transistor; and a plurality of current branches, where the plurality of current branches corresponds to the plurality of delayed input signals and provide a plurality of current components.

Another general aspect includes a method for operating a class-D amplifier. In some embodiments, the class-D amplifier includes a p-type output transistor and an n-type output transistor connected in series with the p-type output transistor. The method includes receiving an input signal. The method also includes generating, using a drive circuit connected to a gate of the n-type output transistor and a gate of the p-type output transistor, a p-type output transistor control signal in response to the input signal. The method also includes generating, using the drive circuit, an n-type output transistor control signal in response to the input signal. The method also includes applying the p-type output transistor control signal to the gate of the p-type output transistor. The method also includes applying the n-type output transistor control signal to the gate of the n-type output transistor. When the input signal becomes logic high, the n-type output transistor control signal becomes logic low fast, while the p-type output transistor control signal becomes logic low gradually. When the input signal becomes logic low, the p-type output transistor control signal becomes logic high fast, while the n-type output transistor control signal becomes logic high gradually.

Implementations may include one or more of the following features. In some embodiments, when the input signal becomes logic high, the p-type output transistor control signal becomes logic low in a stepwise manner. In some embodiments, when the input signal becomes logic low, the n-type output transistor control signal becomes logic high in a stepwise manner.

In some embodiments, the method may include: generating, using a multi-bit delay line circuit, a plurality of delayed input signals; generating, using an n-type current digital-to-analog converter (IDAC), a first current in response to the plurality of delayed input signals; and generating, using a p-type IDAC, a second current in response to the plurality of delayed input signals.

In some embodiments, when the input signal becomes logic high, the method further includes: disconnecting the p-type IDAC from the n-type output transistor; and connecting the n-type IDAC to the p-type output transistor, and wherein the p-type output transistor control signal decreases as the first current increases. In some embodiments, when the input signal becomes logic low, the method further includes: disconnecting the n-type IDAC from the p-type output transistor; and connecting the p-type IDAC to the n-type output transistor, and wherein the n-type output transistor control signal increases as the second current increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a schematic diagram illustrating the operation of the class-D amplifier when the p-type output transistor is gradually turned on.

FIG. 3B is a schematic diagram illustrating the operation of the class-D amplifier 200 when the n-type output transistor is gradually turned on.

DETAILED DESCRIPTION OF THE DISCLOSURE

Figure 1A:
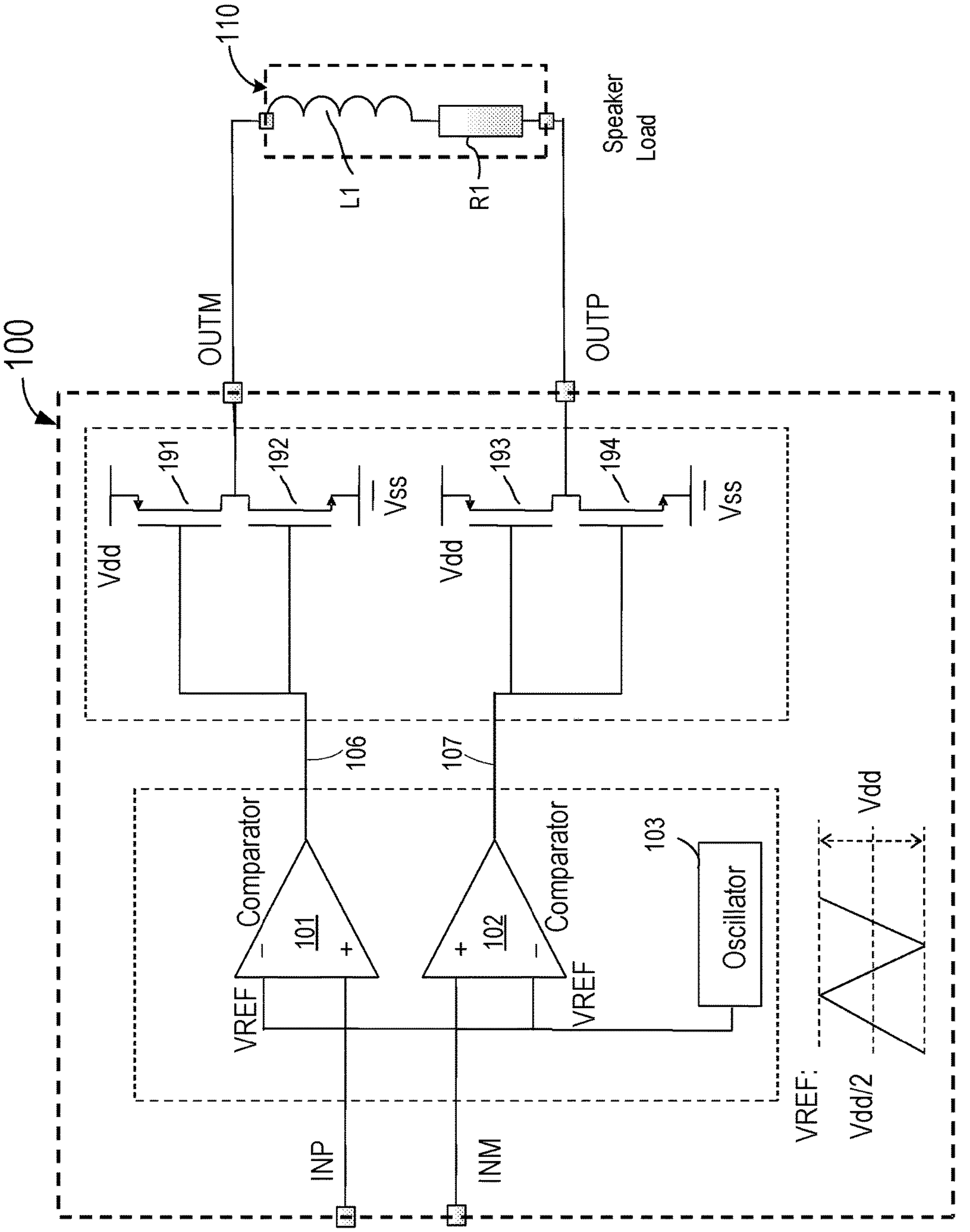
FIG. 1A is a simplified schematic diagram illustrating a conventional class-D amplifier.

The following disclosure provides many different embodiments, or examples, for implementing different features of the subject matter provided. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain ("S/D") region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Class D audio power amplifiers convert audio input signal into high-frequency pulses that switch the output transistors in accordance with the audio input signal. Some class-D amplifiers use pulse width modulators (PWM) to generate a series of conditioning pulses that vary in width according to the amplitude of the audio input signal. The width-varying pulses switch the output transistors at a fixed frequency. Other class-D amplifiers may rely upon other types of pulse modulators. The following discussion will mainly refer to pulse width modulators, but a person of ordinary skill in the art will recognize that class-D amplifiers may be configured with other types of modulators.

FIG. 1A is a simplified schematic diagram illustrating a class-D amplifier 100, which is a conventional class-D amplifier. As shown in FIG. 1A, the class-D amplifier 100 is a differential amplifier. A pair of differential audio input signals INP and INM (i.e., a first audio input signal INP and a second audio input signal INM) are input to a first comparator 101 and a second comparator 102, respectively. Each of the pair of differential audio input signals INP and INM is compared with a triangular signal (i.e., a signal having a triangular waveform) VREF generated from an oscillator 103 to generate a first PWM signal 106 and a second PWM signal 107, respectively. Since the first audio input signal INP and the second audio input signal INM are differential signals and the same triangular signal VREF is used as the reference signal, the first PWM signal and the second PWM signal 107 are differential signals as well (i.e., being the inverse of each other).

The first PWM signal 106 is coupled to the gates of output transistors 191 and 192, which are electrically connected together. The first PWM signal 106, therefore, controls the turning on and turning off the output transistors 191 and 192. The second PWM signal 107 is coupled to the gates of output transistors 193 and 194, which are electrically connected together. The second PWM signal 107, therefore, controls the turning on and turning off the output transistors 193 and 194. As a result, the first output signal OUTM and the second output signal OUTP of the class-D amplifier 100 are differential output signals as well. As shown in FIG. 1A, the first output signal OUTM and the second output signal OUTP are applied to two ends of a speaker load 110, which is represented by an inductor L1 and a resistor R1 in FIG. 1A.

Figure 1B:
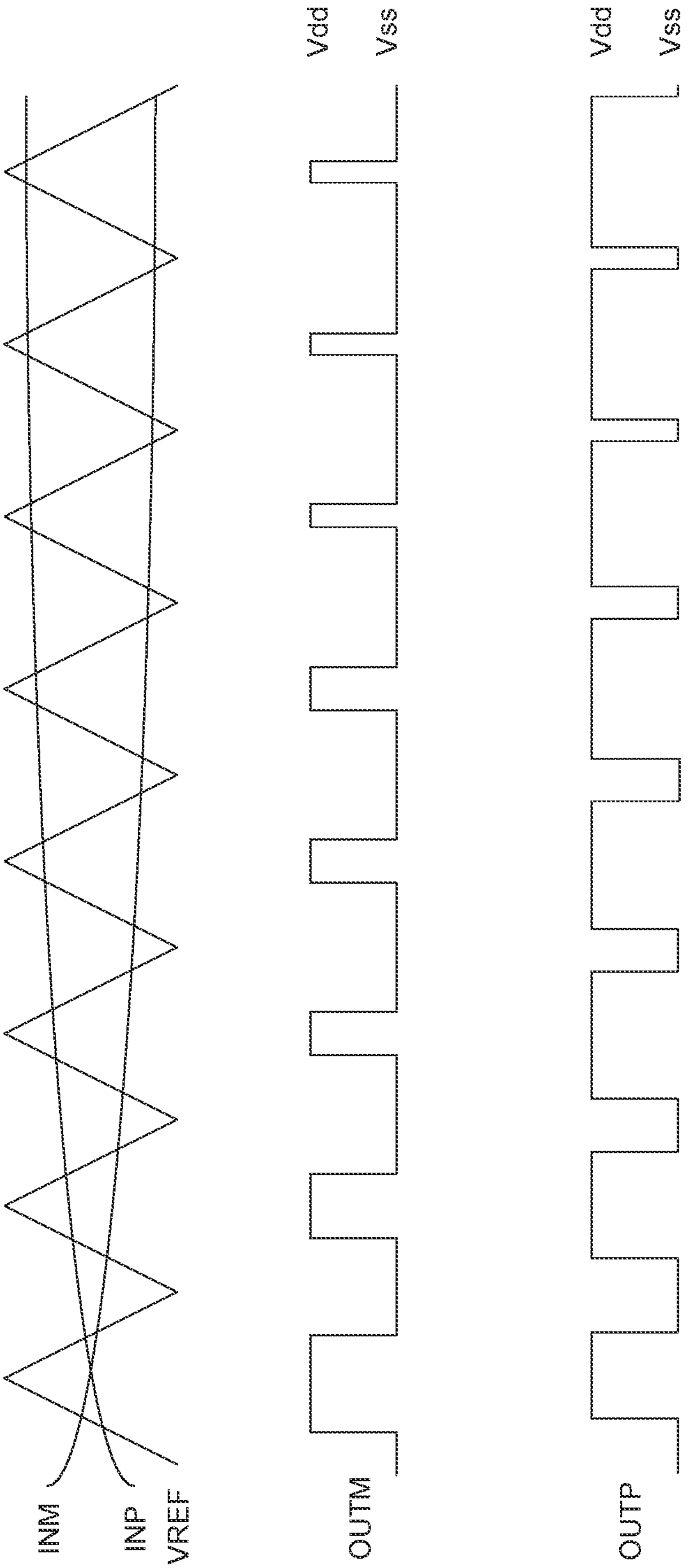
FIG. 1B is a waveform diagram illustrating the modulation of signals in the class-D amplifier shown in FIG. 1A.

FIG. 1B is a waveform diagram illustrating the modulation of signals in the class-D amplifier 100 of FIG. 1A. As shown in FIG. 1B, the first audio input signal INP and the second audio input signal INM are compared with the triangular signal VREF, as described above in connection with FIG. 1A. The output signals of the first comparator 101 and the second comparator 102 are pulse signals at a fixed frequency (i.e., a fixed cycle) whose pulse width is proportional to its corresponding audio input signal. As a result, the first output signal OUTM and the second output signal OUTP are two PWM signals, as shown in FIG. 1B.

The techniques disclosed in the present disclosure helps to improve the output slew rate of the class-D amplifier during switching when the class-D amplifier employs rail-to-rail output voltage swing. The goal is to minimize any overshoot or undershoot, which would degrade the power efficiency of the class-D amplifier. Typically, Class-D amplifiers provide efficiencies over 90% or even about 95%. In order to keep the efficiency as high as possible, the slew rate must be carefully controlled.

Slew rate is defined as the change of voltage (or current, or any other electrical quantity in other instances) per unit of time. Expressed in SI units, the unit of measurement of the slew rate is volts per second (V/s) or volts per microsecond (V/μs). When given for the output of a circuit, such as an amplifier (e.g., a class-D amplifier), the slew rate specification guarantees that the speed of the output signal transition will be at least the given minimum, or at most the given maximum. When applied to the input of a circuit, it indicates that the external driving circuitry needs to meet those limits in order to guarantee the correct operation of the receiving device. If these limits are violated, some error might occur, and the correct operation is no longer guaranteed.

Figure 2:
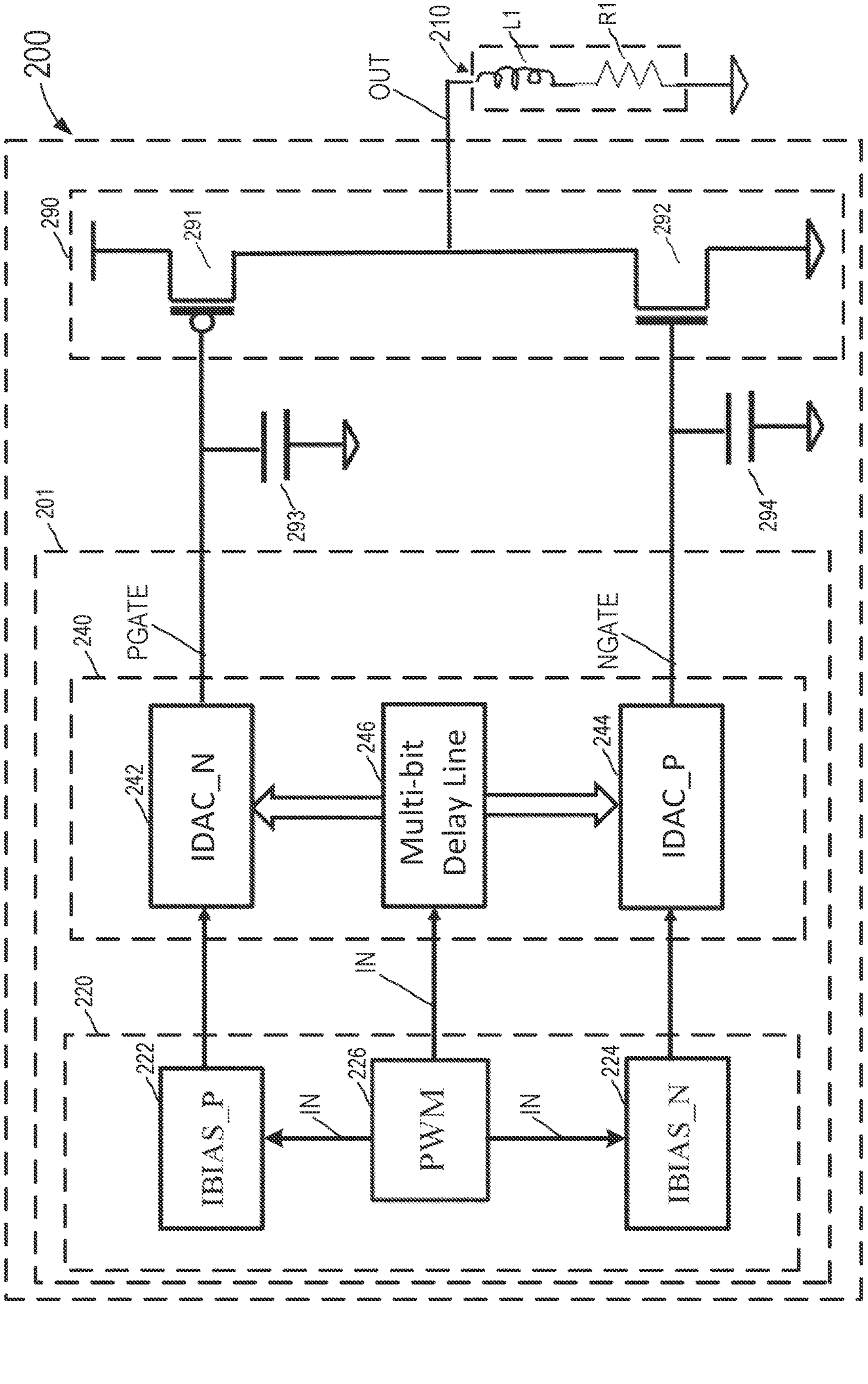
FIG. 2 is a schematic block diagram illustrating a class-D amplifier with an improved slew rate.

FIG. 2 is a schematic block diagram illustrating a class-D amplifier 200 with an improved slew rate. As shown in FIG. 2, the output terminal of the class-D amplifier 200 is connected to an output load (e.g., a speaker load) 210, which is represented by an inductor L1 and a resistor R1, like those shown in FIG. 1A.

In the example shown in FIG. 2, the class-D amplifier 200 includes, among other components, a PWM signal generator 226, a p-type bias current generator (may also be referred to as a "first bias current generator") 222, an n-type bias current generator (may also be referred to as a "first bias current generator") 224, a multi-bit delay line circuit 246, an n-type current digital-to-analog converter (IDAC) (may also be referred to as a "first IDAC") 242, a p-type IDAC (may also be referred to as a "second IDAC") 244, a p-type output transistor 291, an n-type output transistor 292. From another perspective, the class-D amplifier 200 includes, among other components, a drive circuit 201, the p-type output transistor 291, and the n-type output transistor 292. The drive circuit 201 includes, among other components, the PWM signal generator 226, the p-type bias current generator 222, the n-type bias current generator 224, a multi-bit delay line circuit 246, the n-type IDAC 242, the p-type IDAC 244.

The p-type output transistor 291 and the n-type output transistor 292 are connected in series between a lower power rail (e.g., ground) and a higher power rail (e.g., $V_{DD}$). The p-type output transistor 291 and the n-type output transistor 292 are characterized by large dimensions (e.g., channel length, channel width, etc.), as compared to other transistors in the class-D amplifier 200, to drive the output load 210 to meet the desired power efficiency. As a result, the parasitic capacitances 293 and 294 are characterized by a large capacitance, which will make the slew rate smaller (i.e., slowing down the slew rate). In one embodiment, the p-type output transistor 291 is a PMOS transistor, and the n-type output transistor 292 is an NMOS transistor. It should be understood that other types of transistors may be employed for the p-type output transistor 291 and the n-type output transistor 292. One of ordinary skill in the art would recognize many variations, modifications, and alternatives.

The PWM signal generator 226 generates an input signal (labeled as "IN" in FIG. 2). The PWM signal generator 226 may further generates an input bar signal (may be referred to as the "INB" signal and illustrated in FIGS. 4 and 5), which is the complement of the input signal. In one implementation, the PWM signal generator 226 may include a comparator and an oscillator that generates a triangular wave, as discussed above in conjunction with FIGS. 1A and 1B. It should be understood that other architectures of PWM signal generators may be employed in other embodiments.

The multi-bit delay line circuit 246 receives the input signal IN and generates multiple delayed input signals, which are fed to the n-type IDAC 242 and the p-type IDAC 244. Each of these multiple delayed input signals are delayed, with respect to its preceding delayed input signal, by a delay time. FIG. 6 is a diagram illustrating an example multi-bit delay line circuit 246. In the example shown in FIG. 6, the multi-bit delay line circuit 246 includes multiple delay cells connected 602-0, 602-1, . . . , 602-N (collectively, "602") in series. The first delay cell 602-0 receives the input signal IN from the PWM signal generator 226 and delays it by a first delay time, thereby generating a first delayed input signal (labeled as "SEL<0>" in FIG. 6). The second delay cell 602-1 receives the output signal, i.e., the first delayed input signal SEL<0>, from the first delay cell 602-0 and delays it by a second delay time, thereby generating a second delayed input signal (labeled as "SEL<1>" in FIG. 6). This process continues until the last delay cell 602-N generates the last delayed input signal (labeled as "SEL<1>" in FIG. 6), which is delayed (N+1) times with respect to the input signal IN. The last delay cell 602-N may, therefore, also be referred to as the "(N+1)th delay cell 602-N." As will be discussed below in conjunction with FIGS. 4 and 5, the number of delay cells 602 determines the width of the n-type IDAC 242 and the width of the p-type IDAC 244.

In the implementation shown in FIG. 6, each delay cell may include a first inverter 612-1 and a second inverter 612-2 connected in series. The first inverter 612-1 and a second inverter 612-2 may both be NOT gates. A parasitic capacitor 614 is connected between the output terminal of the first inverter 612-1 and the ground. It should be understood that other types of delay cells may be employed in other implementations. In some embodiments, the delay times for each delay cell 602 are identical. In other embodiments, the delay times for each delay cell 602 vary.

Referring back to FIG. 2, the p-type bias current generator 222 is controlled by the input signal IN (and the input bar signal INB). The p-type bias current generator 222 and the n-type IDAC 242 operate to provide a p-type output transistor control signal (labeled as "PGATE" in FIG. 2), which is applied to the gate of the p-type output transistor 291. Likewise, the n-type bias current generator 224 is controlled by the input signal IN (and the input bar signal INB). The n-type bias current generator 224 and the p-type IDAC 244 operate to provide an n-type output transistor control signal (labeled as "NGATE" in FIG. 2), which is applied to the gate of the n-type output transistor 292.

An exemplary implementation of the p-type bias current generator 222 and the n-type IDAC 242 will be discussed below with respect to FIG. 4. An exemplary implementation of the n-type bias current generator 224 and the p-type IDAC 244 will be discussed below with respect to FIG. 5.

Figure 3B:
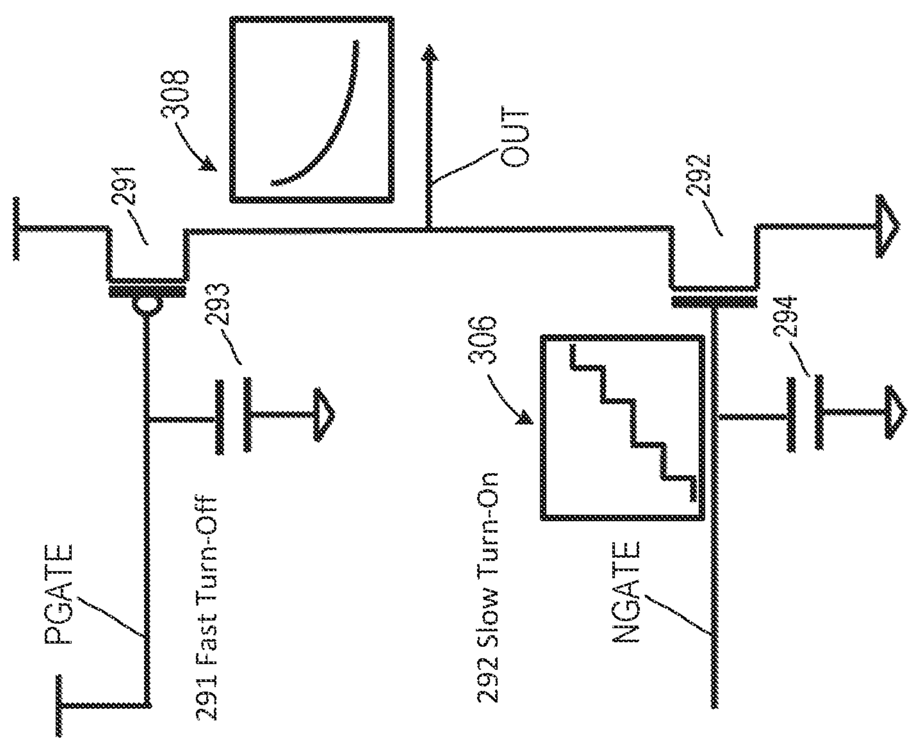
Figure 3A:
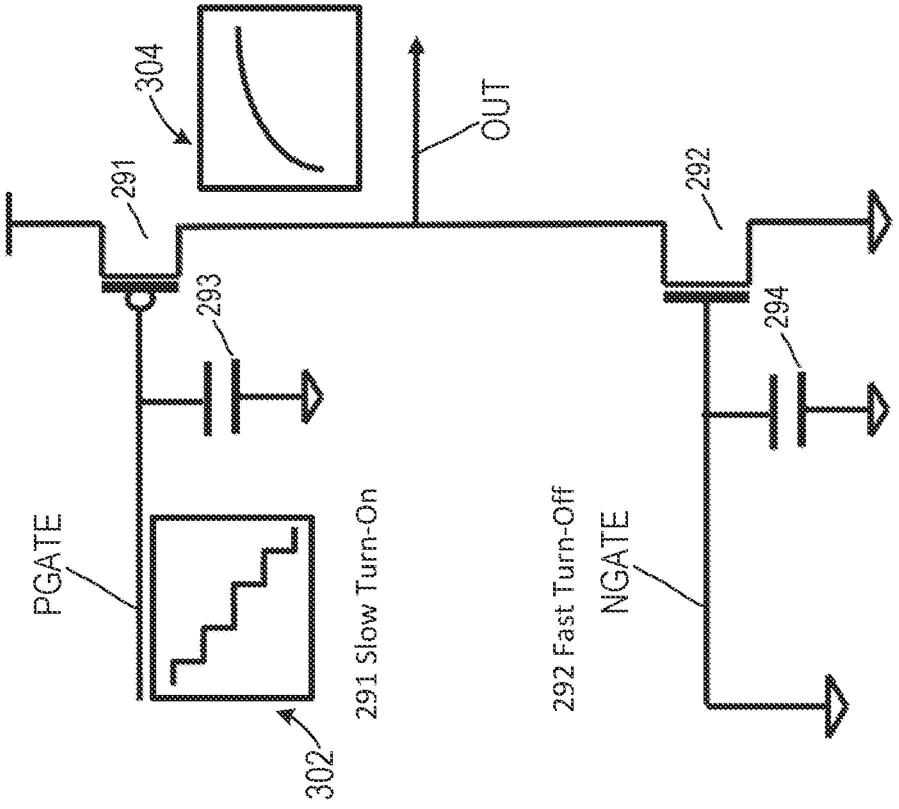

FIG. 3A is a schematic diagram illustrating the operation of the class-D amplifier 200 when the p-type output transistor 291 is gradually turned on. FIG. 3B is a schematic diagram illustrating the operation of the class-D amplifier 200 when the n-type output transistor 292 is gradually turned on.

As shown in FIG. 3A, when the output signal OUT changes from logic low (i.e., "0") to logic high (i.e., "1") (shown as 304 in FIG. 3A), the n-type output transistor 292 is turned off and the p-type output transistor 291 is turned on, therefore pulling the output signal OUT to the higher power rail (e.g., $V_{DD}$). Importantly, the turn-off of the n-type output transistor 292 is fast (i.e., the n-type output transistor control signal NGATE decreases from logic high to logic low fast); the turn-on of the p-type output transistor 291 is gradual (i.e., the p-type output transistor control signal PGATE decreases or is pulled down from logic high to logic low, one step at a time (shown as 302 in FIG. 3A)). As a result, the shoot-through current flowing through the n-type output transistor 292 is low when the p-type output transistor 291 is gradually turned on, because the n-type output transistor 292 is turned off before gradually turning on the p-type output transistor 291. In some embodiments, it takes about 25 ns for the p-type output transistor 291 to be turned on (therefore, "gradually turned on" or "slow turn-on" as labeled in FIG. 3A), whereas it takes about 1 ns for the n-type output transistor 292 to be turned off (therefore, "turned off fast" or "fast turn-off" as labeled in FIG. 3A). In some embodiments, a ratio of the turn-on time of the p-type output transistor 291 to the turn-off time of the n-type output transistor 292 is defined as the first ratio. In some examples, the first ratio is larger than 50. In some examples, the first ratio is larger than 30. In some examples, the first ratio is larger than 25. In some examples, the first ratio is larger than 20. As will be discussed below with reference to FIG. 4, this is enabled by the multi-bit delay line circuit 246, the n-type IDAC 242, and the p-type bias current generator 222.

As shown in FIG. 3B, when the output signal OUT changes from logic high to logic low (shown as 308 in FIG. 3B), the p-type output transistor 291 is turned off and the n-type output transistor 292 is turned on, therefore pulling the output signal OUT to the lower power rail (e.g., ground). Importantly, the turn-off of the p-type output transistor 291 is fast (i.e., the p-type output transistor control signal PGATE increases from logic low to logic high fast); the turn-on of the n-type output transistor 292 is gradual (i.e., the n-type output transistor control signal NGATE increases or is pulled up from logic low to logic high, one step at a time (shown as 306 in FIG. 3B)). As a result, the shoot-through current flowing through the p-type output transistor 291 is low when the n-type output transistor 292 is gradually turned on, because the p-type output transistor 291 is turned off before gradually turning on the n-type output transistor 292. In some embodiments, it takes about 25 ns for the n-type output transistor 292 to be turned on (therefore, "gradually turned on" or "slow turn-on" as labeled in FIG. 3B), whereas it takes about 1 ns for the p-type output transistor 291 to be turned off (therefore, "turned off fast" or "fast turn-off" as labeled in FIG. 3B). In some embodiments, a ratio of the turn-on time of the n-type output transistor 292 to the turn-off time of the p-type output transistor 291 is defined as the second ratio. In some examples, the second ratio is larger than 50. In some examples, the second ratio is larger than 30. In some examples, the second ratio is larger than 25. In some examples, the second ratio is larger than 20. As will be discussed below with reference to FIG. 5, this is enabled by the multi-bit delay line circuit 246, the p-type IDAC 244, and the n-type bias current generator 224.

In addition, the class-D amplifier 200 shown in FIG. 2 can be viewed as comprising three blocks. The first block 220 comprises the PWM signal generator 226, the p-type bias current generator 222, and the n-type bias current generator 224. The first block 220 operates to generate the input signal IN (and the input bar signal INB) and the bias currents needed by the second block 240. The second block 240 comprises the multi-bit delay line circuit 246, the n-type IDAC 242, and the p-type IDAC 244. The second block 240 operates to generate the p-type output transistor control signal PGATE and the n-type output transistor control signal NGATE to be provided to the third block 290. The third block 290 comprises the p-type output transistor 291 and the n-type output transistor 292. The third block 290 operates to generate the output signal OUT based on the p-type output transistor control signal PGATE and the n-type output transistor control signal NGATE. It should be understood that this provides one possible perspective of the class-D amplifier 200, and all components of the class-D amplifier 200 function as a whole.

Figure 4:
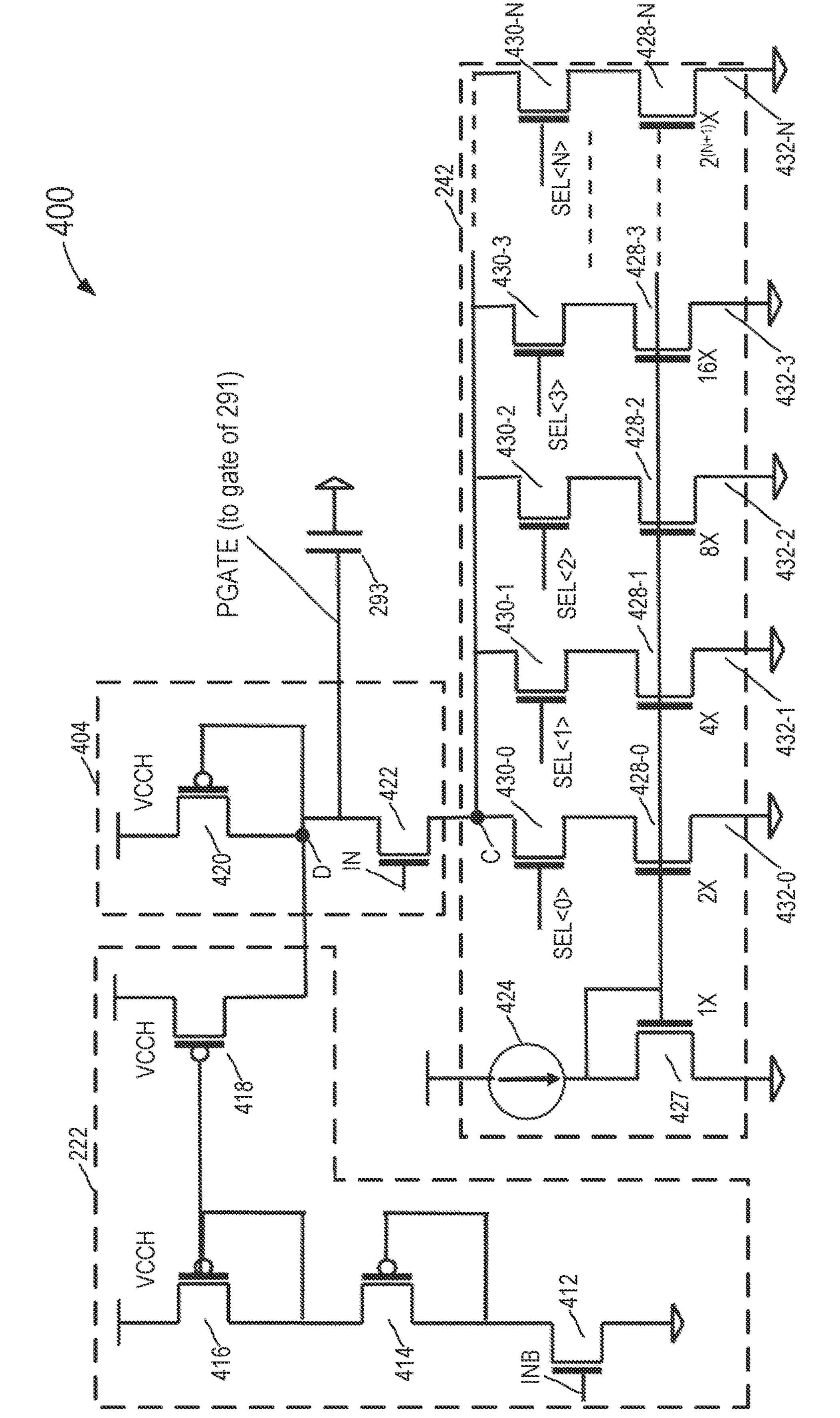
FIG. 4 is a diagram illustrating a portion of the class-D amplifier in accordance with some embodiments.

FIG. 4 is a diagram illustrating a portion 400 of the class-D amplifier 200 in accordance with some embodiments. As discussed above, the portion 400 functions as the p-type bias current generator 222 and the n-type IDAC 242 shown in FIG. 3. It should be understood that one of ordinary skill in the art would recognize many variations, modifications, and alternatives.

In the example shown in FIG. 4, the portion 400 receives the input signal IN and the input bar signal INB and generates the p-type output transistor control signal PGATE to be applied to the gate of the p-type output transistor 291. As discussed above, the input bar signal INB is the complement of the input signal IN.

The portion 400 includes, among other components, a bias current generator 222, the p-type pre-driver 404, and the n-type IDAC 242. In the example shown in FIG. 4, the bias current generator 222 includes an n-type transistor 412 and three p-type transistors 414, 416, and 418 with the topology shown in FIG. 4. The n-type transistor 412, the p-type transistors 414 and 416 are connected in series between the ground and a positive voltage (e.g., VCCH). In one example, VCCH is 12 volts, although it can be other numbers in other embodiments. The gate of the n-type transistor 412 receives the input bar signal INB. The gates of the p-type transistors 416 and 418 are connected together. The p-type bias current generator 222 functions as a current mirror.

The p-type pre-driver 404, in the example shown in FIG. 4, includes an n-type transistor 422 and a p-type transistor 420 connected in series between the positive voltage (e.g., VCCH) and the n-type IDAC 242 with the topology shown in FIG. 4. The gate of the n-type transistor 422 receives the input signal IN.

The p-type transistors 418 and 420 are connected in parallel. A first source/drain (S/D) end of the p-type transistor 420 is connected to the positive voltage (e.g., VCCH), and a second S/D end of the p-type transistor 420 is connected to both its own gate and the first S/D end of the p-type transistor 420.

In the example shown in FIG. 4, the n-type IDAC 242 includes a current source 424, an n-type transistor 427 connected in series with the current source 424, and multiple current branches 432-0, 432-1, 432-3, . . . , 432-N (collectively, "432"). Each current branch includes an access transistor 430 and an n-type current generating transistor 428. The n-type current generating transistors 428 have a common gate configuration. The access transistors 430 correspond to the delay cells 602 of the multi-bit delay line circuit 246 shown in FIG. 6. The gate of each access transistor 430 receives one of the multiple delayed input signals SEL<0> to SEL<N> generated by the multi-bit delay line circuit 246 shown in FIG. 6. If a delayed input signal is logic high, the corresponding current branch 432 is selected, and the current flowing through the corresponding current generating transistor 428 is collected at the Node C shown in FIG. 4.

In the example shown in FIG. 4, the n-type current generating transistor 428 are characterized by different dimensions so that the current generated by them are $2^{(N+1)}$ times of the current flowing through the n-type transistor 427, where N is 0, 1, 2, 3, . . . , N. Therefore, the more current branches 432, the higher granularity or resolution the n-type IDAC 242 can provide.

In the example shown in FIG. 4, when the input signal IN is logic low, the input bar signal INB is logic high. As a result, the n-type transistor 422 is turned off, and the n-type transistor 412 is turned on. The p-type transistors 414, 416, and 418 are turned on, and the voltage at Node D is pulled up to the positive voltage (e.g., VCCH). The current flowing through the p-type transistors 414 and 416 is mirrored into the current flowing through the p-type transistor 418.

Thus, the p-type transistor 420 is turned on because the gate of the p-type transistor 420 is connected to Node D. Accordingly, the p-type output transistor 291 is disconnected from the n-type IDAC 242, and the p-type output transistor control signal PGATE is pulled up to the supply voltage (e.g., VCCH), thereby turning off the p-type output transistor 291. As will be discussed below with reference to FIG. 5, when the input signal IN is logic low, the n-type output transistor control signal PGATE gradually increases, thereby gradually turning on the n-type output transistor 292. As a result, the output signal OUT is logic low.

On the other hand, when the input signal IN is logic high, the input bar signal INB is logic low. As a result, the n-type transistor 422 is turned on, connecting the p-type output transistor 291 to the n-type IDAC 242, and the n-type transistor 412 is turned off. The p-type transistors 414, 416, and 418 are turned off. The p-type transistor 420 is a diode-connected transistor (e.g., a diode-connected MOSFET). Therefore, the p-type output transistor control signal PGATE is equal to the supply voltage (e.g., VCCH) minus the voltage across the p-type transistor 420, and the voltage across the p-type transistor 420 is determined by the current provided by the n-type IDAC 242 and the dimensions of the p-type transistor 420.

As discussed above, the n-type IDAC 242 includes multiple current branches 430 that can be independently controlled by the multiple delayed input signals SEL<0> to SEL<N> generated by the multi-bit delay line circuit 246 shown in FIG. 6. Therefore, the current provided by the n-type IDAC 242 at the Node C can be changed one-step at a time. Thus, the p-type output transistor control signal PGATE gradually decreases, as shown in FIG. 3A. Accordingly, the p-type output transistor 291 is turned on gradually. As will be discussed below with reference to FIG. 5, when the input signal IN is logic high, the n-type output transistor control signal NGATE becomes logic high fast, thereby turning off the n-type output transistor 292 fast. As a result, the output signal OUT is logic high.

In one example, the n-type output transistor control signal PGATE varies in the range between about 7 V and about 12 V. It should be understood that the range can be fine-tuned as needed in other embodiments depending on specific design requirements.

Figure 5:
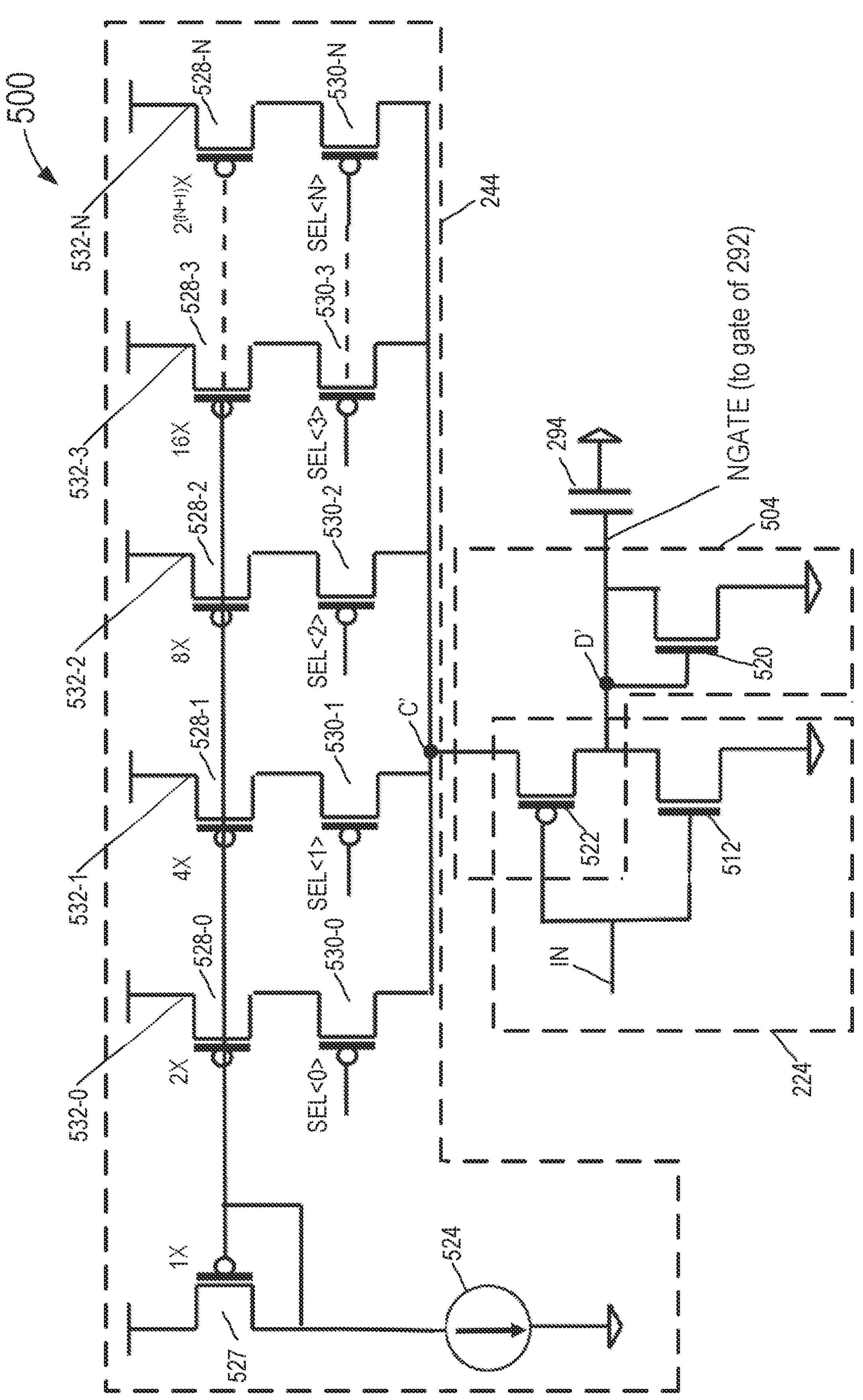
FIG. 5 is a diagram illustrating another portion of the class-D amplifier in accordance with some embodiments.
Figure 6:
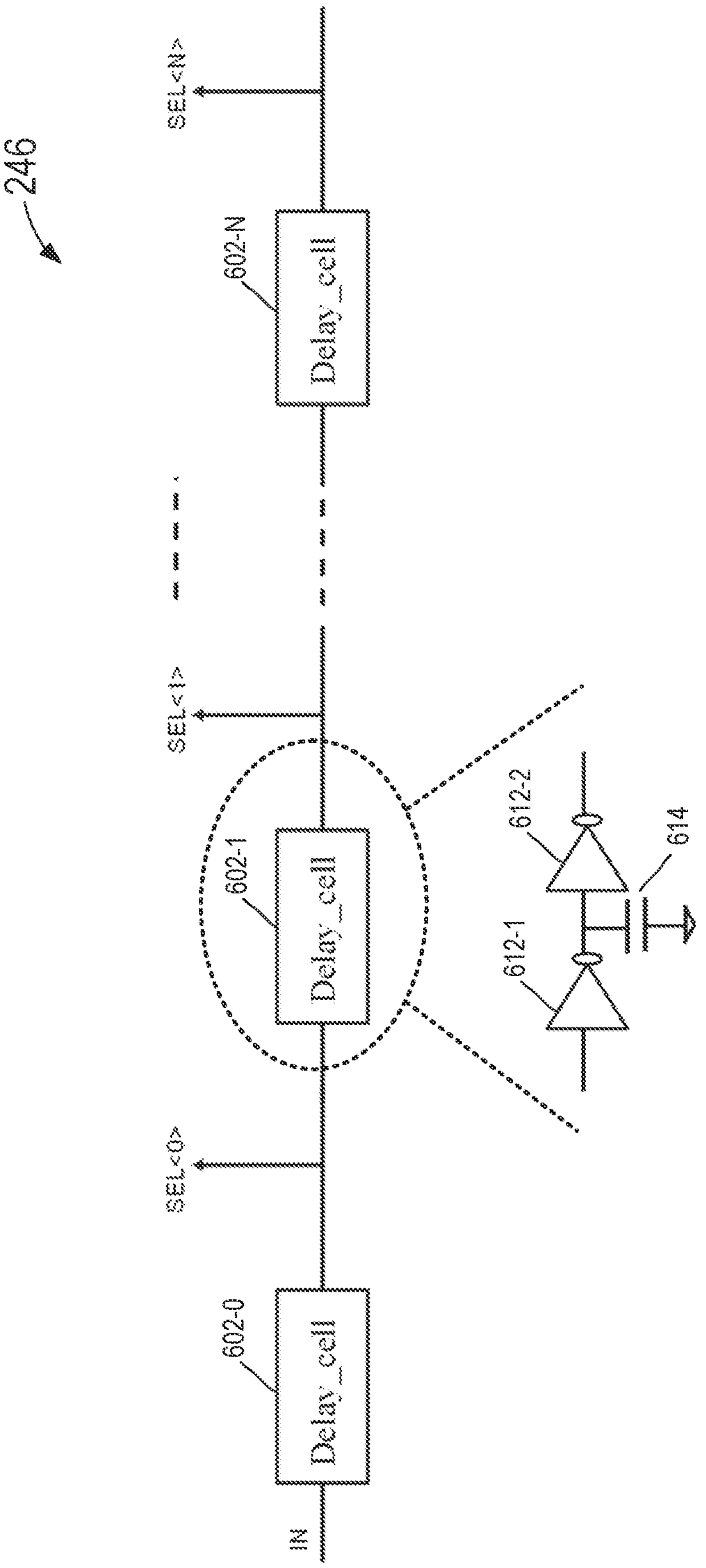
FIG. 6 is a diagram illustrating an example multi-bit delay line circuit.

FIG. 5 is a diagram illustrating a portion 500 of the class-D amplifier 200 in accordance with some embodiments. As discussed above, the portion 500 functions as the n-type bias current generator 224 and the p-type IDAC 244 shown in FIG. 3. It should be understood that one of ordinary skill in the art would recognize many variations, modifications, and alternatives.

In the example shown in FIG. 5, the portion 500 receives the input signal IN and generates the n-type output transistor control signal NGATE to be applied to the gate of the n-type output transistor 292.

The portion 500 includes, among other components, a bias current generator 224, the n-type pre-driver 504, and the p-type IDAC 244. In the example shown in FIG. 5, the bias current generator 224 includes an n-type transistor 512 and a p-type transistor 522 with the gates thereof connected together. The n-type transistor 512 and the p-type transistor 522 form an inverter. The n-type transistor 512 and the p-type transistor 522 are connected in series between the ground and the Node C'. Both the gate of the n-type transistor 512 and the gate of the p-type transistor 522 receive the input bar signal IN. The n-type bias current generator 224 functions as an inverter.

The n-type pre-driver 504, in the example shown in FIG. 5, includes a p-type transistor 522 and an n-type transistor 520 connected in series between the ground and the p-type IDAC 244 with the topology shown in FIG. 5. The gate of the p-type transistor 522 receives the input signal IN.

The n-type transistors 512 and 520 are connected in parallel. A first source/drain (S/D) end of the n-type transistor 520 is connected to ground, and a second S/D end of the n-type transistor 520 is connected to its own gate.

In the example shown in FIG. 5, the p-type IDAC 244 includes a current source 524, a p-type transistor 527 connected in series with the current source 524, and multiple current branches 532-0, 532-1, 532-3, . . . , 532-N (collectively, "532"). Each current branch includes an access transistor 530 and a p-type current generating transistor 528. The access transistors 530 correspond to the delay cells 602 of the multi-bit delay line circuit 246 shown in FIG. 6. The gate of each access transistor 530 receives one of the multiple delayed input signals SEL<0> to SEL<N> generated by the multi-bit delay line circuit 246 shown in FIG. 6. If a delayed input signal is logic high, the corresponding current branch 532 is selected, and the current flowing through the corresponding current generating transistor 528 is collected at the Node C' shown in FIG. 5.

In the example shown in FIG. 5, the p-type current generating transistor 528 are characterized by different dimensions so that the current generated by them are $2^{(N+1)}$ times of the current flowing through the p-type transistor 527, where N is 0, 1, 2, 3, . . . , N. Therefore, the more current branches 532, the higher granularity or resolution the p-type IDAC 244 can provide.

In the example shown in FIG. 5, when the input signal IN is logic high, the p-type transistor 522 is turned off, and the n-type transistor 512 is turned on, and the voltage at Node D' is pulled up to ground.

Accordingly, the n-type output transistor 292 is disconnected from the p-type IDAC 244, and the n-type output transistor control signal NGATE is pulled up to ground, thereby turning off the n-type output transistor 292. As discussed above with reference to FIG. 4, when the input signal IN is logic high, the p-type output transistor control signal PGATE gradually decreases, thereby gradually turning on the p-type output transistor 291. As a result, the output signal OUT is logic high.

On the other hand, when the input signal IN is logic low. As a result, the p-type transistor 522 is turned on, connecting the n-type output transistor 292 to the p-type IDAC 244, and the n-type transistor 512 is turned off. The n-type transistor 520 is a diode-connected transistor (e.g., a diode-connected MOSFET). Therefore, the n-type output transistor control signal NGATE is equal to the voltage across the n-type transistor 520, and the voltage across the n-type transistor 520 is determined by the current provided by the p-type IDAC 244 and the dimensions of the n-type transistor 520.

As discussed above, the p-type IDAC 244 includes multiple current branches 530 that can be independently controlled by the multiple delayed input signals SEL<0> to SEL<N> generated by the multi-bit delay line circuit 246 shown in FIG. 6. Therefore, the current provided by the p-type IDAC 244 at the Node C' can be changed one-step at a time. Thus, the n-type output transistor control signal NGATE gradually increases, as shown in FIG. 3B. Accordingly, the n-type output transistor 292 is turned on gradually. As discussed above with reference to FIG. 4, when the input signal IN is logic low, the p-type output transistor control signal PGATE becomes logic high fast, thereby turning off the p-type output transistor 292 fast. As a result, the output signal OUT is logic low.

In one example, the n-type output transistor control signal NGATE varies in the range between about 0 V and about 4.5 V. It should be understood that the range can be fine-tuned as needed in other embodiments depending on specific design requirements.

Figure 7:
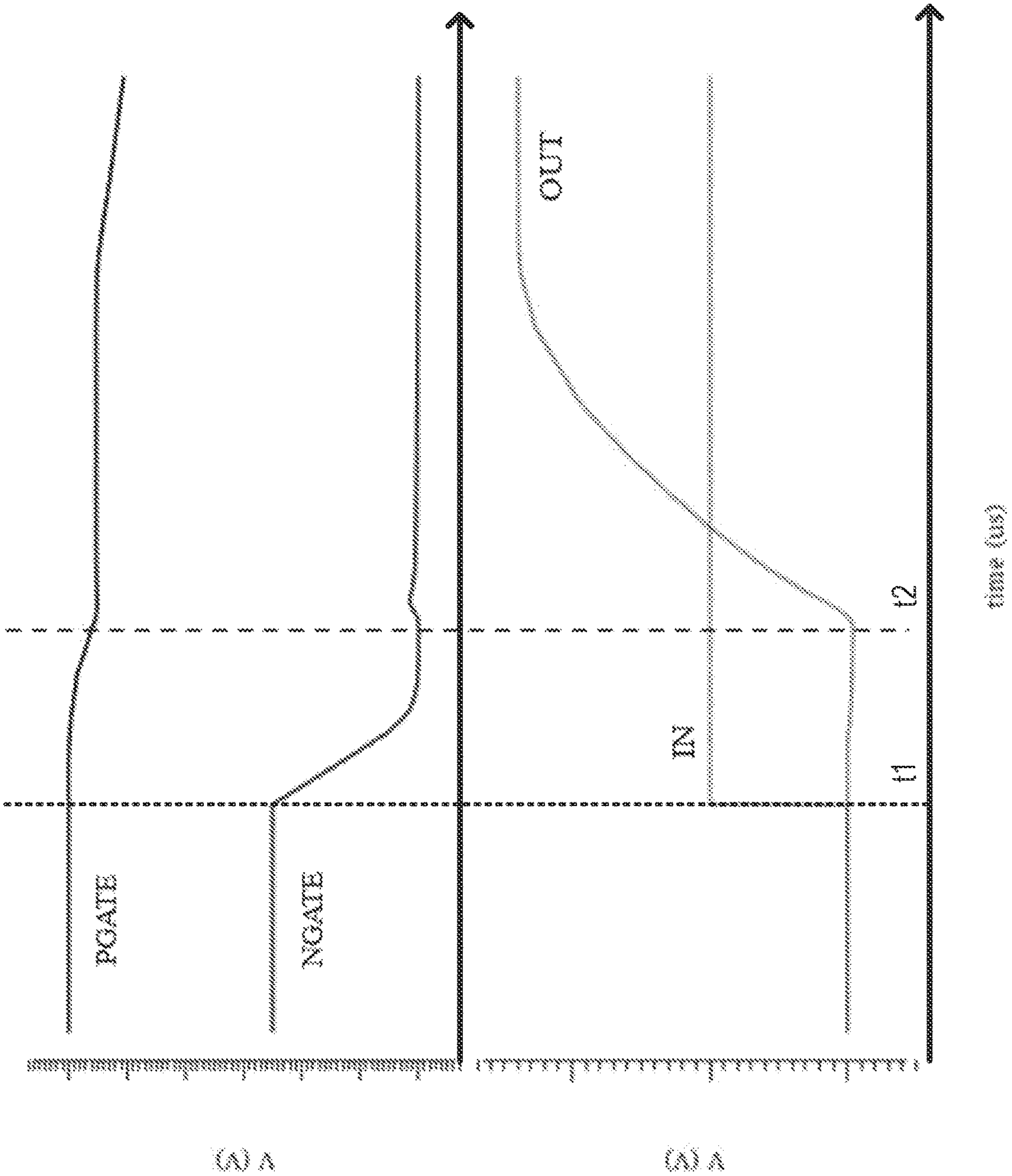
FIG. 7 is a diagram illustrating the p-type output transistor control signal, the n-type output transistor control signal, the input signal, and the output signal when the input signal turns to logic high.

FIG. 7 is a diagram illustrating the p-type output transistor control signal PGATE, the n-type output transistor control signal NGATE, the input signal, and the output signal when the input signal turns to logic high. In the example shown in FIG. 7, at time t1, the input signal IN turns logic high. Accordingly, the n-type output transistor control signal NGATE turns logic low fast, and the p-type output transistor control signal PGATE turns logic low gradually. As a result, the n-type output transistor 292 is turned off fast, and the p-type output transistor 291 is turned on gradually. Therefore, the output signal OUT begins to turn to logic high at time t2, when the p-type output transistor control signal PGATE reaches logic low. As shown in FIG. 7, the slew rate is improved.

Figure 8:
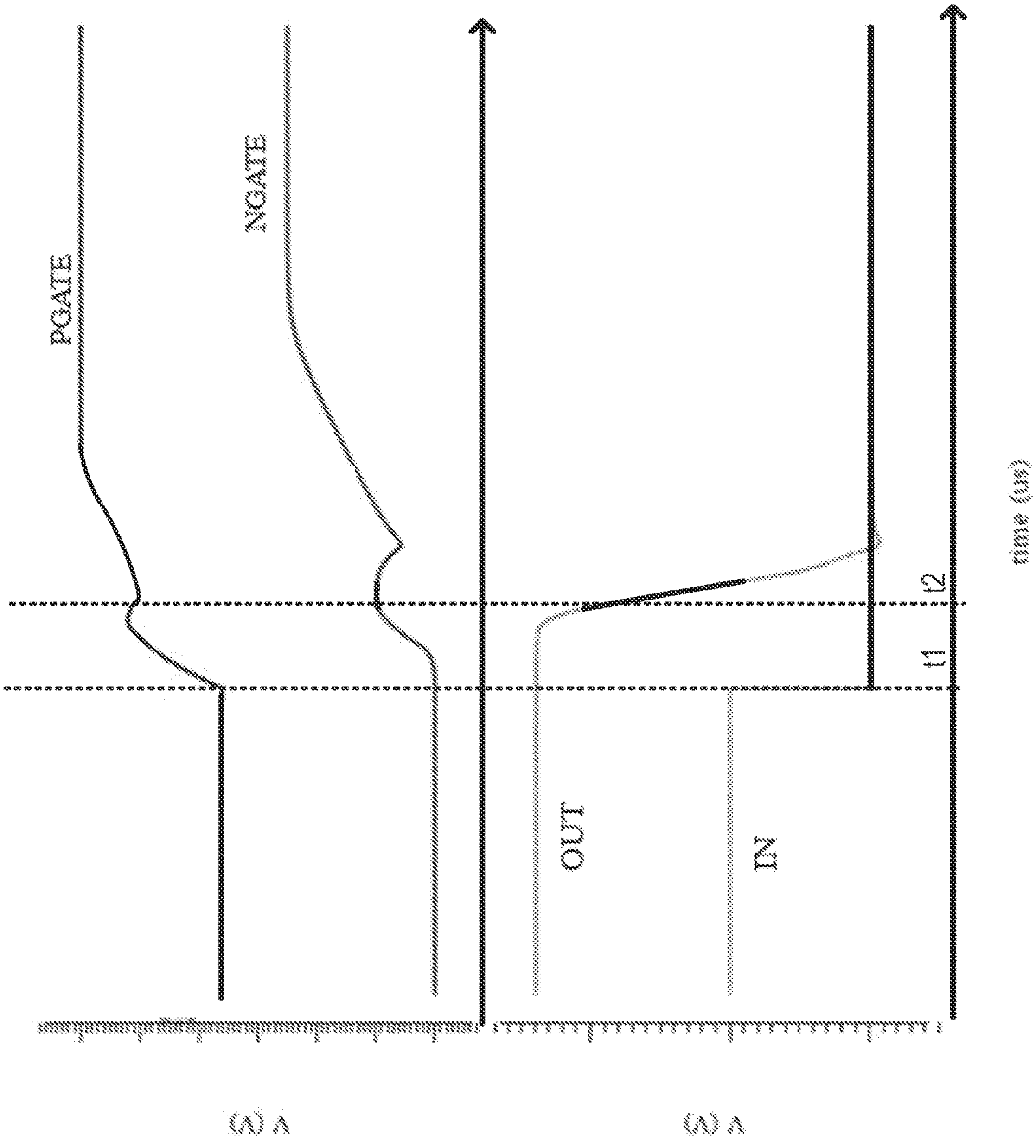
FIG. 8 is a diagram illustrating the p-type output transistor control signal, the n-type output transistor control signal, the input signal, and the output signal when the input signal turns to logic low.
Figure 9:
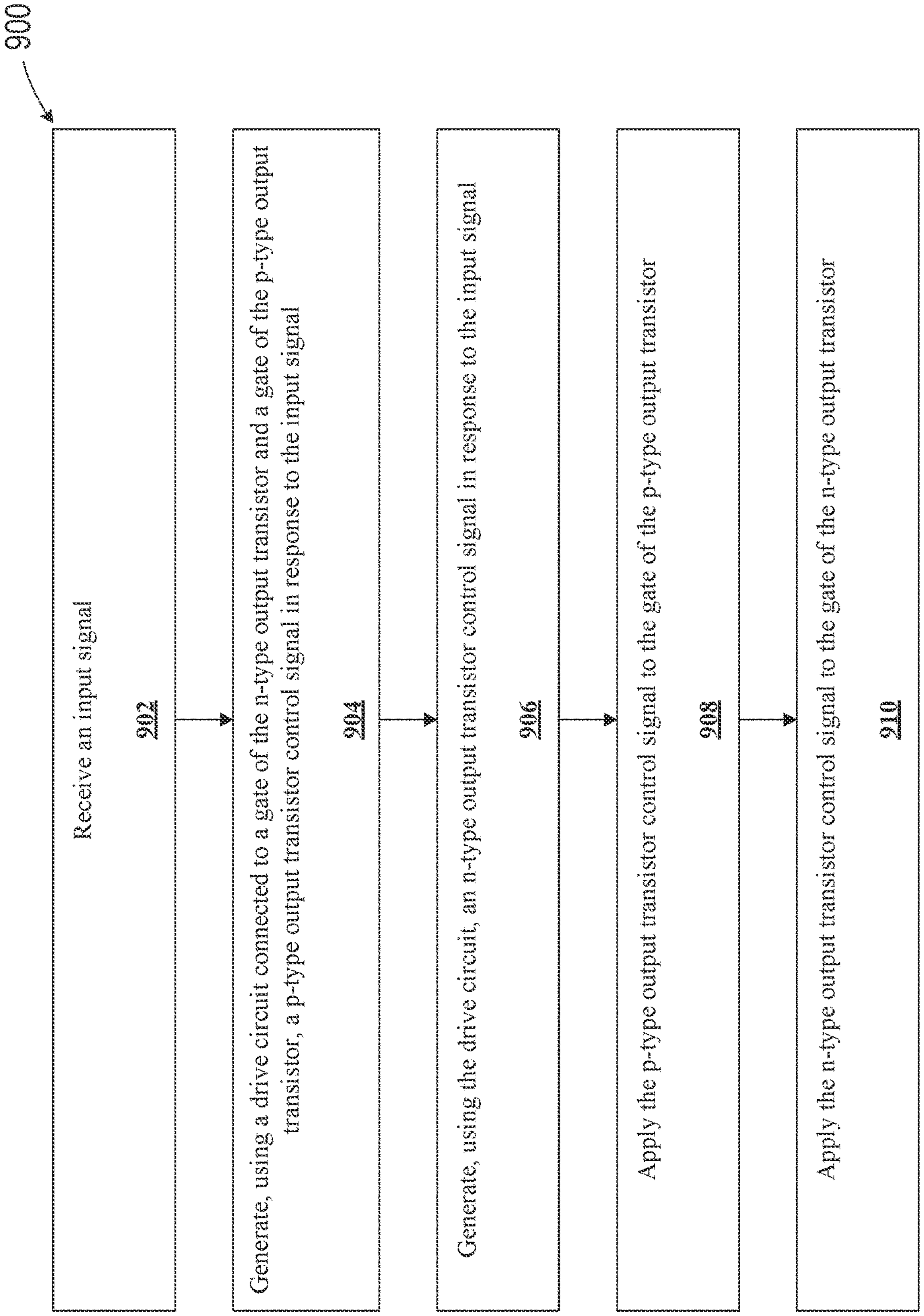
FIG. 9 is a flowchart diagram illustrating an example method for operating a class-D amplifier.

FIG. 8 is a diagram illustrating the p-type output transistor control signal PGATE, the n-type output transistor control signal NGATE, the input signal, and the output signal when the input signal turns to logic low. In the example shown in FIG. 8, at time t1, the input signal IN turns logic low. Accordingly, the n-type output transistor control signal NGATE turns logic high gradually, and the p-type output transistor control signal PGATE turns logic high fast. As a result, the p-type output transistor 291 is turned off fast, and the n-type output transistor 292 is turned on gradually. Therefore, the output signal OUT begins to turn to logic low at time t2, when the n-type output transistor control signal NGATE reaches logic high. As shown in FIG. 8, the slew rate is improved. FIG. 9 is a flowchart diagram illustrating an example method for operating a class-D amplifier (e.g., the class-D amplifier 200 shown in FIG. 2). The method starts at step 902, an input signal (e.g., IN shown in FIG. 2) is received. At step 904, a p-type output transistor control signal (e.g., PGATE shown in FIG. 2) is generated in response to the input signal. In one implementation, the p-type output transistor control signal is generated using a drive circuit (e.g., the drive circuit 201 shown in FIG. 2) connected to a gate of the n-type output transistor and a gate of the p-type output transistor. At step 906, an n-type output transistor control signal (e.g., NGATE shown in FIG. 2) is generated in response to the input signal. Likewise, the n-type output transistor control signal is generated using a drive circuit (e.g., the drive circuit 201 shown in FIG. 2). At step 908, the p-type output transistor control signal is applied to the gate of the p-type output transistor (e.g., 291 shown in FIG. 2). At step 910, the n-type output transistor control signal is applied to the gate of the n-type output transistor (e.g., 292 shown in FIG. 2). When the input signal becomes logic high, the n-type output transistor control signal becomes logic low fast, while the p-type output transistor control signal becomes logic low gradually (e.g., as shown in FIG. 3A). When the input signal becomes logic low, the p-type output transistor control signal becomes logic high fast, while the n-type output transistor control signal becomes logic high gradually (e.g., as shown in FIG. 3A). It should be understood that additional steps may be employed. It should also be understood that the order of the steps may vary in other embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A class-D amplifier, comprising:

a p-type output transistor;

an n-type output transistor connected in series with the p-type output transistor; and a drive circuit connected to a gate of the p-type output transistor and a gate of the n-type output transistor, wherein the drive circuit receives an input signal, and the drive circuit generates, in response to the input signal, a p-type output transistor control signal applied to the gate of the p-type output transistor, and the drive circuit generates, in response to the input signal, an n-type output transistor control signal applied to the gate of the n-type output transistor;

wherein the drive circuit comprises a multi-bit delay line circuit that receives the input signal and generates a plurality of delayed input signals, and a current digital-to-analog converter configured to generate a current in response to the plurality of delayed input signals, and wherein the drive circuit generates the p-type output transistor control signal and the n-type output transistor control signal based on the current;

wherein when the input signal becomes logic high, the n-type output transistor control signal becomes logic low fast, while the p-type output transistor control signal becomes logic low gradually; and wherein when the input signal becomes logic low, the p-type output transistor control signal becomes logic high fast, while the n-type output transistor control signal becomes logic high gradually.

2. The class-D amplifier of claim 1, wherein when the input signal becomes logic high, the n-type output transistor control signal becomes logic low fast, while the p-type output transistor control signal becomes logic low gradually, so that the p-type output transistor is turned on gradually after the n-type output transistor is turned off.

3. The class-D amplifier of claim 1, wherein when the input signal becomes logic high, the p-type output transistor control signal becomes logic low in a stepwise manner.

4. The class-D amplifier of claim 1, wherein when the input signal becomes logic low, the p-type output transistor control signal becomes logic high fast, while the n-type output transistor control signal becomes logic high gradually, so that the n-type output transistor is turned on gradually after the p-type output transistor is turned off.

5. The class-D amplifier of claim 1, wherein when the input signal becomes logic low, the n-type output transistor control signal becomes logic high in a stepwise manner.

6. The class-D amplifier of claim 1, wherein the current digital-to-analog converter comprises an n-type current digital-to-analog converter (IDAC) configured to generate a first current and a p-type IDAC configured to generate a second current, each in response to the plurality of delayed input signals; and wherein the drive circuit further comprises a pulse width modulation (PWM) signal generator generating the input signal, an n-type transistor connected between the p-type output transistor and the n-type IDAC, and a p-type transistor connected between the n-type output transistor and the p-type IDAC.

7. The class-D amplifier of claim 6, wherein when the input signal becomes logic high, the p-type transistor is turned off, thereby disconnecting the p-type IDAC from the n-type output transistor, while the n-type output transistor control signal becomes logic low.

8. The class-D amplifier of claim 7, wherein when the input signal becomes logic high, the n-type transistor is turned on, thereby connecting the n-type IDAC to the p-type output transistor, and the p-type output transistor control signal decreases as the first current increases.

9. The class-D amplifier of claim 6, wherein when the input signal becomes logic low, the n-type transistor is turned off, thereby disconnecting the n-type IDAC from the p-type output transistor, while the p-type output transistor control signal becomes logic high.

10. The class-D amplifier of claim 9, wherein when the input signal becomes logic low, the p-type transistor is turned on, thereby connecting the p-type IDAC to the n-type output transistor, and the n-type output transistor control signal increases as the second current increases.

11. The class-D amplifier of claim 6, wherein the input signal is a PWM signal.

12. The class-D amplifier of claim 6, wherein the multi-bit delay line circuit comprises a plurality of delay cells connected in series, each delay cell providing a delay time.

13. The class-D amplifier of claim 12, wherein the delay time of the plurality of delay cells vary.

14. The class-D amplifier of claim 6, wherein the p-type IDAC comprises: a first current source; a first p-type transistor; and a plurality of current branches, wherein the plurality of current branches corresponds to the plurality of delayed input signals and provide a plurality of current components.

15. The class-D amplifier of claim 6, wherein the n-type IDAC comprises: a second current source; a first n-type transistor; and a plurality of current branches, wherein the plurality of current branches corresponds to the plurality of delayed input signals and provide a plurality of current components.

16. A method for operating a class-D amplifier comprising a p-type output transistor and an n-type output transistor connected in series with the p-type output transistor, the method comprising:

receiving an input signal;

generating, using a drive circuit connected to a gate of the n-type output transistor and a gate of the p-type output transistor, a p-type output transistor control signal in response to the input signal;

generating, using the drive circuit, an n-type output transistor control signal in response to the input signal;

applying the p-type output transistor control signal to the gate of the p-type output transistor; and applying the n-type output transistor control signal to the gate of the n-type output transistor; and generating, using a multi-bit delay line circuit, a plurality of delayed input signals from the input signal;

generating, using a current digital-to-analog converter, a current in response to the plurality of delayed input signals;

generating the p-type output transistor control signal and the n-type output transistor control signal based on the current;

wherein when the input signal becomes logic high, the n-type output transistor control signal becomes logic low fast, while the p-type output transistor control signal becomes logic low gradually, and wherein when the input signal becomes logic low, the p-type output transistor control signal becomes logic high fast, while the n-type output transistor control signal becomes logic high gradually.

17. The method of claim 16, wherein when the input signal becomes logic high, the p-type output transistor control signal becomes logic low in a stepwise manner.

18. The method of claim 16, wherein when the input signal becomes logic low, the n-type output transistor control signal becomes logic high in a stepwise manner.

19. The method of claim 16, wherein the current digital-to-analog converter comprises an n-type current digital-to-analog converter (IDAC) and a p-type IDAC, and wherein generating the current comprises generating, using the n-type IDAC, a first current, and generating, using the p-type IDAC, a second current, each in response to the plurality of delayed input signals.

20. The method of claim 19, further comprising: when the input signal becomes logic high: disconnecting the p-type IDAC from the n-type output transistor; and connecting the n-type IDAC to the p-type output transistor, and wherein the p-type output transistor control signal decreases as the first current increases; and when the input signal becomes logic low: disconnecting the n-type IDAC from the p-type output transistor; and connecting the p-type IDAC to the n-type output transistor, and wherein the n-type output transistor control signal increases as the second current increases.

* * * * *